United States Patent [19]
Toda et al.

[11] Patent Number: 5,095,463
[45] Date of Patent: Mar. 10, 1992

[54] SEMICONDUCTOR MEMORY DEVICE

[75] Inventors: Haruki Toda; Mitsugi Ogura, both of Yokohama, Japan

[73] Assignee: Kabushiki Kaisha Toshiba, Kawasaki, Japan

[21] Appl. No.: 586,217

[22] Filed: Sep. 21, 1990

[30] Foreign Application Priority Data

Sep. 22, 1989 [JP] Japan ................. 1-247569

[51] Int. Cl.$^5$ .............................................. G11C 13/00
[52] U.S. Cl. ........................... 365/189.07; 365/189.01; 365/203
[58] Field of Search ....................... 365/189.01, 189.07, 365/203

[56] References Cited

U.S. PATENT DOCUMENTS 4,899,317  2/1990  Hoekstra et al. ............... 365/203

Primary Examiner—Terrell W. Fears
Attorney, Agent, or Firm—Foley & Lardner

[57] ABSTRACT

A novel semiconductor memory device having address comparator, word line drive circuit sense circuit, and control circuit is disclosed. The comparator judges whether or not a row address read in the present access cycle is in correspondence with that in the last cycle. Where it is judged that the former is not in correspondence with the latter, the control circuit allows the sense circuit to select a word line by this row address to transfer data of a memory cell to the bit line to allow the sense means to sense. On the other hand, where it is judged by the comparator that the former is in correspondence with the latter, since data of the memory cell belonging to the same word line is already sensed in the last cycle, the control circuit allows the readout circuit to read out data from a bit line corresponding to the column address without causing the sense circuit to carry out a sense operation for a second time. Thus, only when the row address changes with respect to that in the last cycle, a sense operation is caused to be carried out. Thus, the readout operation can be performed at a high speed.

3 Claims, 10 Drawing Sheets

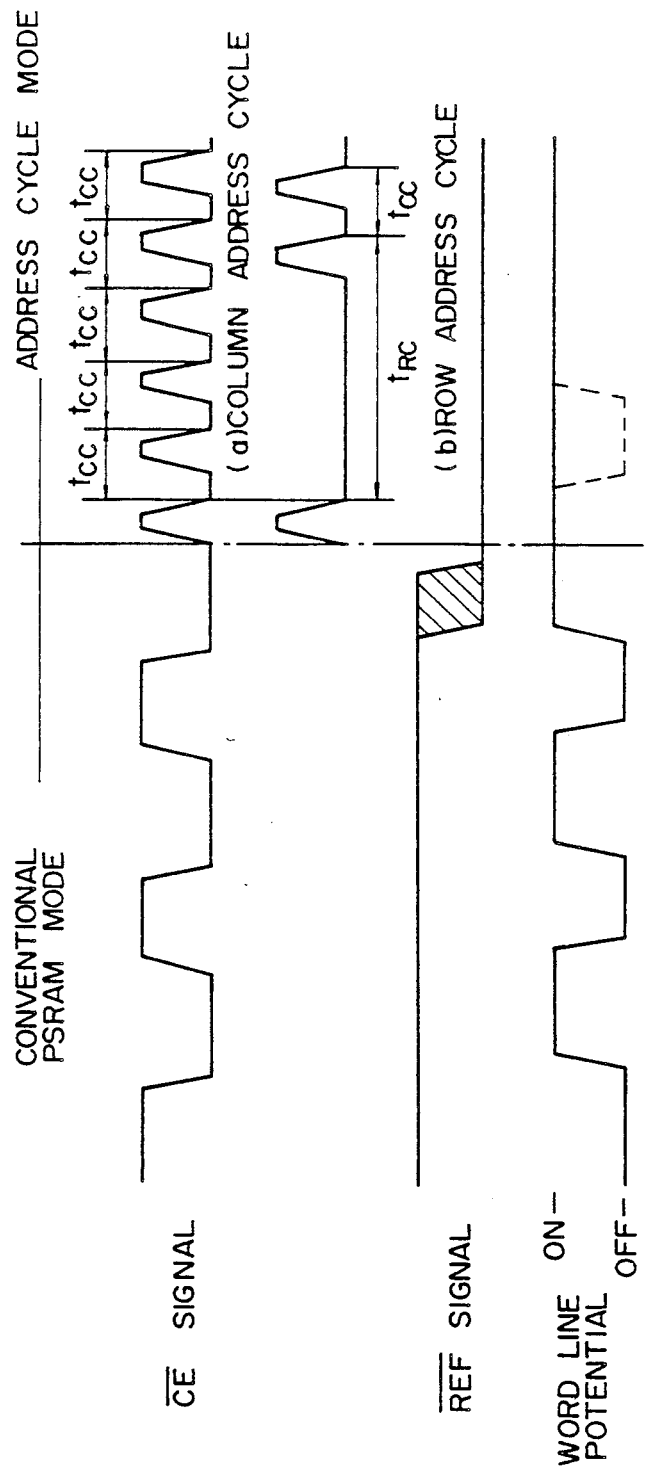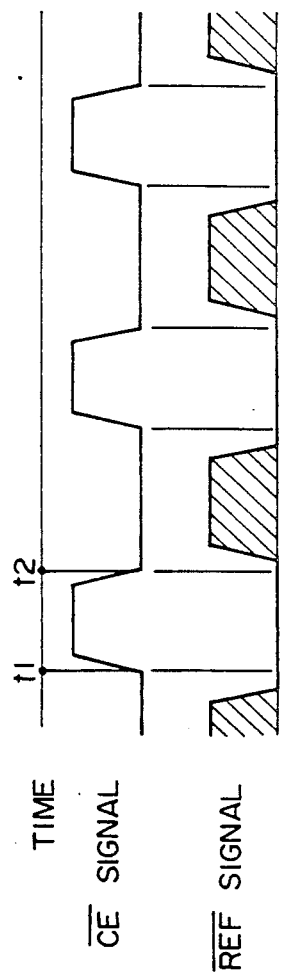
FIG. 4
FIG. 5

SEMICONDUCTOR MEMORY DEVICE

BACKGROUND OF THE INVENTION

This invention relates to a semiconductor memory device, and more particularly, to a device permitting data readout operation at high speed.

A method of accessing data in an ordinary DRAM will be first described with reference to FIG. 10 in which the configuration of the memory cell periphery is shown. Memory cells as a memory cell array are arranged in a matrix manner. One memory cell is of a structure including a pair of a charge hold capacitor Cla and a charge transfer transistor Tla connected to one sense amplifier 101 by a bit line pair 301a and 301b, respectively. Selection of each memory cell is made by the row address and the column address. The row address is the address relating to selection of word lines 201, 202, ... connected to the transfer transistor, and the column address is the address relating to the selection of I/0 transfer gates Gl, ..., Gm connected to sense amplifiers 101, ..., 10m to function as switch circuits, respectively.

In such a DRAM, in reading out data held in any memory cell, an approach is employed to first select any one of word lines 201, 202, ... by the address to raise a potential thereon to transfer data of a memory cell connected to that word line to any one of bit line pairs 301a, 301b, ... 30ma, 30mb. Data thus transferred is amplified by any one of sense amplifiers 101, ..., 10m, thus allowing potentials on respective bit line pairs 301a, 301b, .. . 30ma, 30mb to be equal to a potential difference corresponding to data stored in the connected memory cell. Then, any one of I/0 transfer gates Gl, ..., Gm connected to the memory cell to be read out is selected by a column address. Thus, data of one bit line pair is outputted from the I/O line.

Data has been read out in the prior art in this way. The ratio of the time until sense of a bit line is completed after the row address is established to the time when the column address is required takes a considerably large value of ½ to ⅔ of the entire access time. For example, in the case of DRAM having the entire access time of 80 ns, it takes 40 to 50 ns for sensing the bit line. This constitutes an obstacle to high speed. In this case, since the row address and the column address have a time difference therebetween at a necessary timing, DRAM adopts a multiplex system of taking both addresses from a shared address pin thereinto.

In accordance with this system, the readout of data is divided into the portion corresponding to the row address and the portion corresponding to the column address. For this reason, in the access cycle where the row address does not change with respect to that in the last cycle, but only the column address changes, data of a memory cell connected to the same word line in the last cycle is already sensed. Thus, by immediately selecting an I/O transfer gate by the column address, the access time can be shortened. This system can read out data in a time one half to one third than that in the case of sensing data for a second time.

However, in the case of the multiplex system, since the control method becomes complicated, this system is not suitable for small scale systems. An address system similar to that in SRAM is demanded. To cope with such a demand, PSRAM (Pseudo Static RAM) has been newly used in medium and small scale computer systems in recent years. Such PSRAM is not based on the multiplex system as in DRAMs, but is based on a system similar to that in SRAM to give the row address and the column address at the same time, to thus generate timings used in respective circuits in the chip. This advantageously provides the following merits: A control signal for fetching a column address ($\overline{CAS}$ signal) required for the multiplex system becomes unnecessary; the control circuit is not more complicated than that in DRAM; the cost per bit is lower than that of SRAM.

The readout operation of a certain kind of such a PSRAM will be described in conjunction with the timing chart of respective signals of FIG. 11. When the chip enable signal ($\overline{CE}$ signal) is at high (H) level, the bit line is equalized and precharged. Further, the word line is placed in a reset precharge state. At time t1 when the $\overline{CE}$ signal falls from H level to low (L) level, an address is fetched. Thus, an access of data is initiated. In this example, a row address is fetched at the fall time t1 of the $\overline{CE}$ signal. The time for maintaining this signal level varies depending upon the kind of the address latch systems. In the case of latch, it is sufficient to maintain this level until t2. With respect to the dotted portions subsequent thereto, in the case where no latch operation is performed, it is necessary to maintain the level irrespective of what level is until t4. With respect to the hatched portions subsequent to t4, it is unnecessary to hold the signal level in any event. Thus, the row address is held until the rise time t3 of the $\overline{CE}$ signal. On the other hand, the level change of the column address is detected by the transition detector for detecting changes in the signal level. Thus, selection of I/O transfer gate is carried out, and data is read out.

At this time, where the row address and the column address are both different those in the last cycle, the cycle time is represented by $t_c$ in the figure (generally about 150 ns), and the access time is represented by $t_{CEA}$. Where only the column address is different from that in the last cycle, the cycle time is represented by $t_{SC}$ (about 50 ns), and the access time is represented by $t_{CA}$. Accordingly, where the row address is the same as that in the last access cycle, an approach is employed to immediately read out data of a memory cell connected to the same word line already sensed from a bit line corresponding to the column address, thereby permitting the readout operation to be performed at a high speed.

However, in order to allowing the readout operation to be performed at a high speed in this way, it is necessary to change the $\overline{CE}$ signal as shown in dependency upon whether the row address changes or does not change. This requires an extra logic circuit. Further, it is necessary that the row address is latched at the fall time of the $\overline{CE}$ signal, and the column address is detected by the transition detector for a time period during which the $\overline{CE}$ signal is at L level. For this reason, it is required to discriminate which portion of the address corresponds to the row address on the system side. As a result, an employment of PSRAM in place of DRAM results in the problem that the merit that simplification can be made in medium and small systems is reduced.

SUMMARY OF THE INVENTION

Accordingly, an object of this invention is to provide a semiconductor memory device capable of providing a high speed readout operation, simplifying the system, and improving the data transfer efficiency.

According to the present invention, there is provided a semiconductor memory device comprising: hold means for holding row addresses at least in the access cycle and the last access cycle of fetched addresses, comparison means for judging whether or not said row address in the present access cycle and the row address in the last access cycle are in correspondence with each other, a circuit for selecting a word line by a fetched row address to drive it, means for precharging a bit line of a memory cell belonging to the selected word line, means for sensing data transferred from the memory cell to said precharged bit line, means for selecting a transfer gate by a column address of the fetched addresses to open the transfer gate, to thus read out data from a corresponding bit line, and control means responsive to a judged result from the comparison means wherein when said row address fetched in the present access cycle is not in correspondence with the row address fetched in the last access cycle, the control means allows the sense means to carry out a sense operation on the basis of the present row address, and allows the readout means to read out data on the basis of the present column address, while when the row address fetched in the present access cycle is in correspondence with the row address fetched in the last access cycle, the control means allows the data readout means to read out data already sensed in the access cycle on the basis of the present column address without causing the sense means to carry out a sense operation.

In accordance with this invention, whether or not a row address read in the present access cycle is in correspondence with a row address in the last cycle held is judged by the comparison means. Where it is judged that the former is not in correspondence with the latter, the control means allows the sense means to select a word line by this row address to transfer data of a memory cell belonging to this word line to the bit line to allow the sense means to sense it. Thereafter, the control means allows the data readout means to select and open a transfer gate by a column address fetched this time to read out data from a corresponding bit line. On the other hand, where it is judged by the judgment means that the former is in correspondence with the latter, since data of the memory cell belonging to the same word line is already sensed in the last cycle, the control means allows the readout means to read out data from a bit line corresponding to the column address without causing the sense means to carry out a sense operation for a second time. As stated above, only when the row address changes with respect to that in the last cycle, a sense operation which requires much time is caused to be carried out. Thus, the readout operation can be performed at a high speed. In this case, in the inside of this device, a procedure is taken to discriminate which portion of an address which has been read corresponds to the row address to judge whether or not this row address changes with respect to that in the last cycle to carry out switching of the operation in dependency upon the judged result. Accordingly, it is unnecessary to discriminate the address on the system side. Thus, the device can be simplified as the system. Further, since it is unnecessary for the system side to alter the control in dependency upon whether or not the row address changes, the control system of the system is simplified, thus permitting the cost to be reduced.

Furthermore, where the device is further provided with wait signal output means, when it is judged by the judgment means that the present row address is not in correspondence with that in the preceding cycle, a wait signal is outputted to the system side. Thus, the next cycle is not initiated until the present access cycle is completed.

In addition, where the device is further provided with an operational mode switching means, when an operational mode switching signal is received from the system side, the sense means is caused to perform a sense operation every access cycle at all times irrespective of whether or not the row address changes with respect to that in the last access cycle. By permitting switching of the operational mode in this way, compatibility with existing software is maintained. Thus, the labor required for making new software can be saved.

BRIEF DESCRIPTION OF THE DRAWINGS

In the accompanying drawings:

FIGS. 4 and 5 are timing charts showing respective signal waveforms in making a switching setting of the operational mode in a semiconductor memory device according to an embodiment of this invention.

DESCRIPTION OF THE PREFERRED EMBODIMENT

Figure 1:
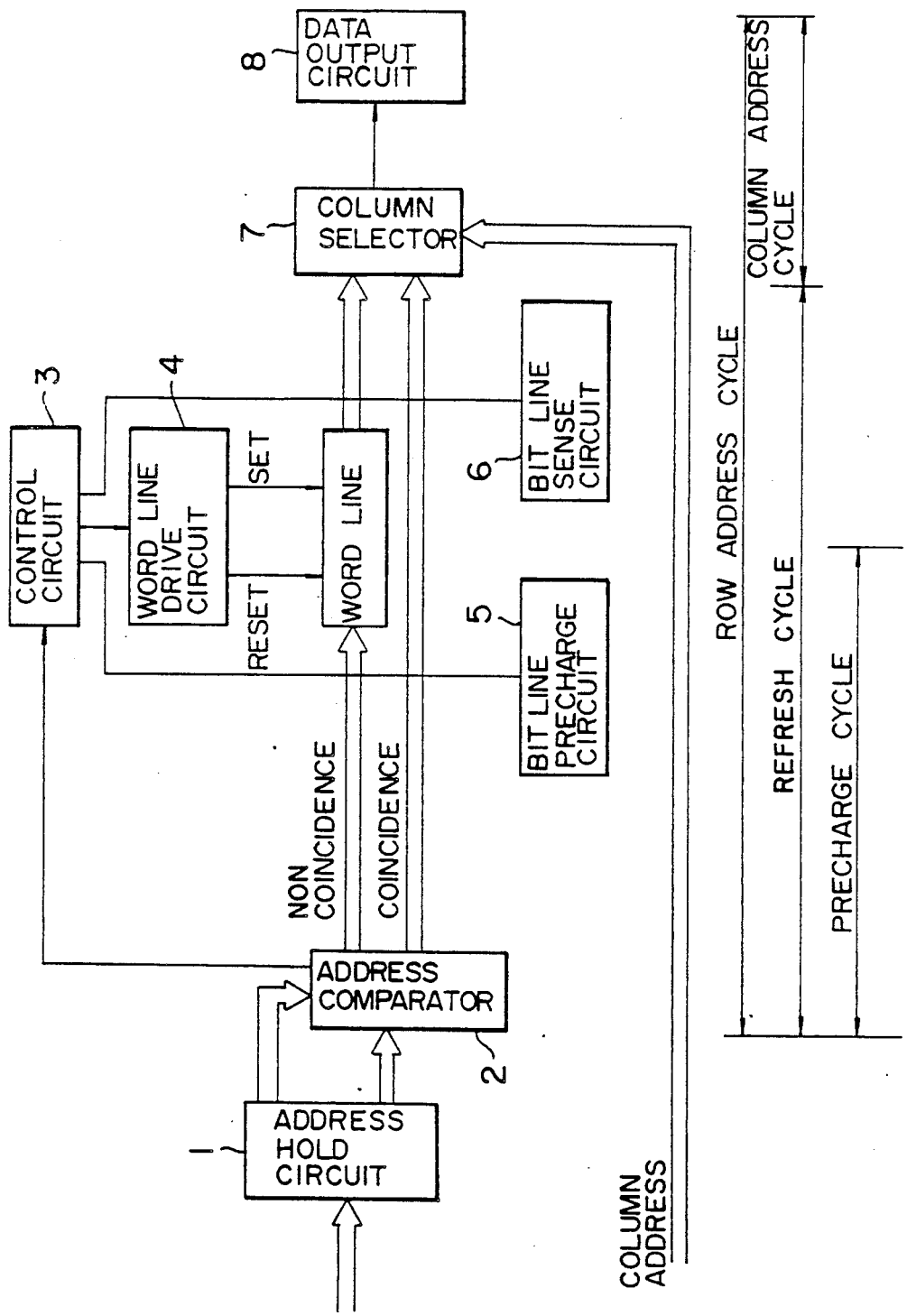
FIG. 1 is a block diagram showing the operation procedure in an operational mode in a semiconductor memory device according to an embodiment of this invention.

An embodiment of this invention will now be described with reference to the attached drawings. FIG. 1 is a block diagram showing the procedure of the configuration and the operational mode of this device. This figure shows the procedure of switching between a row address cycle in the case where mainly the row address changes with respect to that in the last cycle and a column address cycle where the row address does not change with respect to that in the last cycle. The reason why the address is divided into the row address and the column address is based on distinction on the device side. On the system side, i.e., CPU, such distinction is unnecessary. The address includes the portion corresponding to the row address and the portion corresponding to the column address. For system configuration, it is preferable to allocate high-order bits which change to a relatively small degree to the row address.

The row address is first read in to judge by the address comparator whether or not that row address is in correspondence with a row address in the last access cycle held in the latch circuit. In the case of non-coincidence, a new row address is held to enter the row address cycle. Reset of the word line and precharge of the bit line are carried out. Upon completion of this operation, a word line corresponding to the present row address is selected to transfer to the bit line, data in a memory cell connected to this word line. Thereafter, the operation enters the column address cycle. By the fetched column address, an I/O transfer gate is selected and opened. Thus, data is outputted from the bit line. The row address cycle in this case requires a prolonged time as shown in the figure.

On the contrary, where the row address does not change with respect to that in the last access cycle, the operation immediately enters the column address cycle without carrying out a sense operation for a second time. The I/O transfer gate selected by the column address is opened. Thus, data is outputted. The column address cycle in this case is considerably shortened when compared to the row address cycle. When the row address cycle is compared with that in the case of the conventional DRAM, the time required until data output is delayed because the precharge is first put, but the entire cycle is the same as that in the conventional case except that the position where the precharge cycle is put varies. Further, in this case, when the memory is in a wait state, it is not in the state of precharge, but is in the state where sense of the bit line is completed. This is a remarkable difference from the conventional DRAMs.

Figure 2:
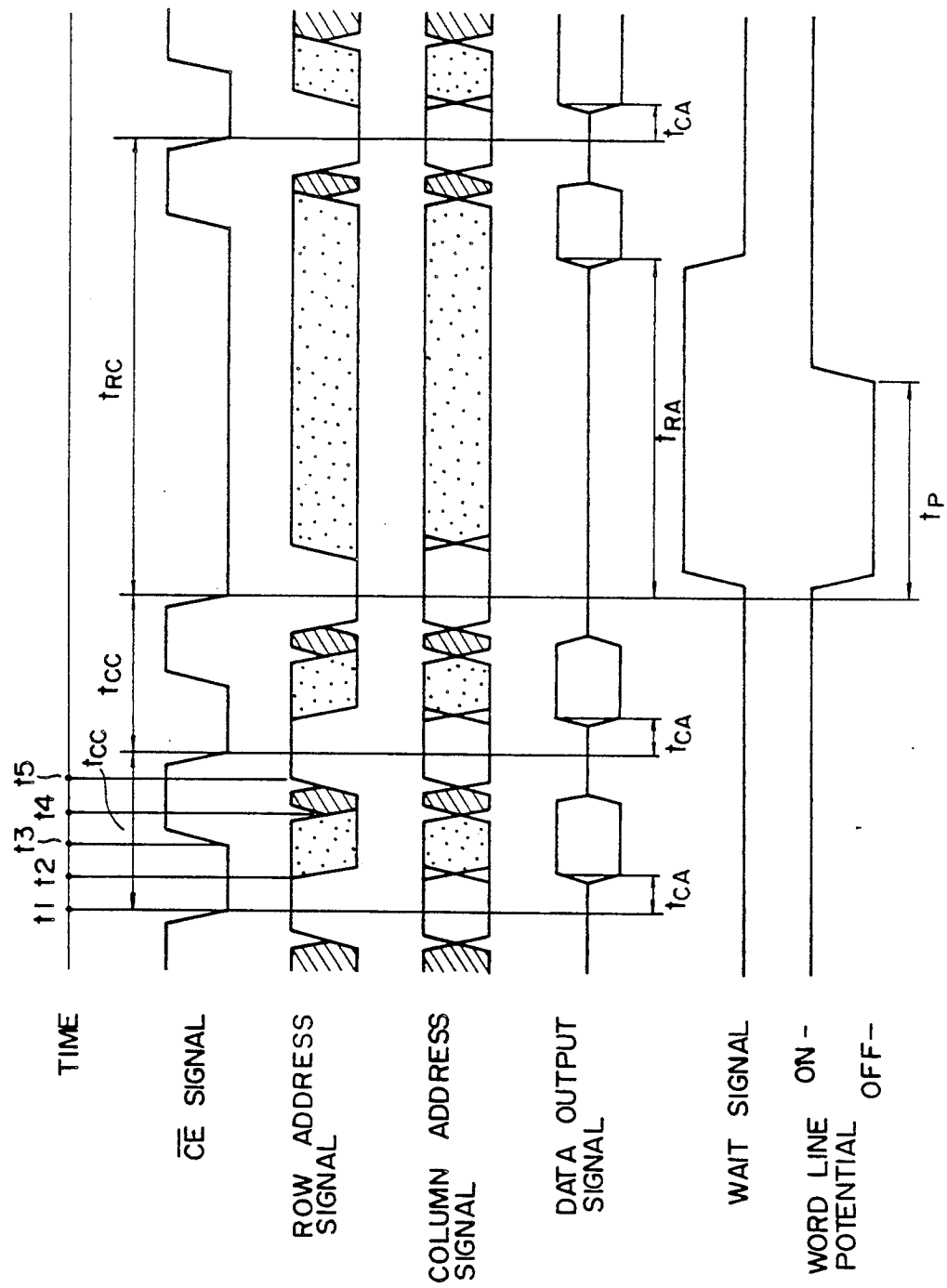
FIG. 2 is a timing chart showing waveforms of respective signals in the above-mentioned device.

FIG. 2 is a timing chart showing the waveforms of respective signals in this embodiment wherein an indication is made by comparison between the case of the column address cycle and the case of the row address cycle. In the row address cycle, as described above, the cycle time $t_{RC}$ takes a prolonged value of, e.g., 150 ns. Within the cycle time, about 50 ns is required as the precharge time, and about 80 ns is required as the access time $t_{RA}$. On the contrary, in the column address cycle, only about 50 ns is required as the cycle time $t_{CC}$. The cycle time in this case is considerably shortened as compared to the cycle time $t_{RC}$ 150 ns required in the row address cycle. Further, the access time $t_{CA}$ from the time when data is read out up to the time when data is outputted is about 30 ns.

In FIG. 2, the dotted portion represents a time period where it is unnecessary to maintain the signal level in the case of latching the address, and the hatched portion represents a time period where what level is insignificant even in the case no latch operation is carried out. It is sufficient to fetch a row address signal at the time t1 when the $\overline{CE}$ signal has fallen, e.g., in the column address cycle to hold this level until the time t2 in the case of carrying a latch operation. In the case where no latch operation is carried out, it is necessary to hold the level until the time t4, but what level is insignificant for a time period from the time t4 until time t5 for entering the next cycle.

In the case where the row address changes with respect to that in the last access cycle to enter the row address cycle, a wait signal notifying that the system should wait so as not to initiate the next access cycle is outputted from this device to the system side to notify a difference between the row address cycle time $t_{RC}$ and the column address cycle time $t_{CC}$. This notification may be implemented, e.g., by allowing the wait signal to change to H level as shown in FIG. 2. However, it is needless to say that such a notification may be implemented by any signal except for that mentioned above. In this case, the potential on the word line is at the L level for a time period (time $t_P$) subject to equalizing and precharging, and is placed in a sensible state after this time period has expired.

Figure 3:
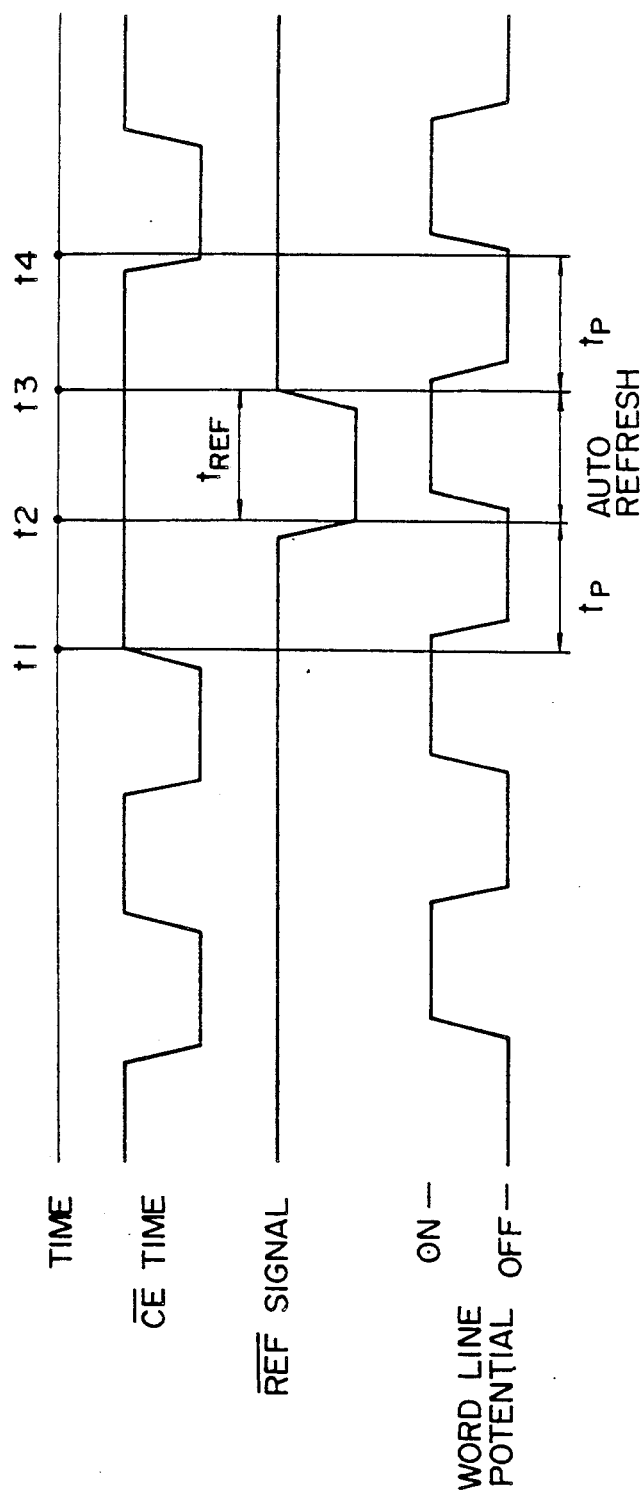
FIG. 3 is a timing chart showing respective signal waveforms in setting a refresh mode in a conventional PSRAM.

As stated above, by carrying out a proper use of the row address cycle or the column address cycle in dependency upon presence and absence of changes in the row address, the readout operation can be made at a high speed. When this device is caused to have compatibility with the conventional software, the device can be used without newly rewriting the existing software. This is convenient. To realize this, it is sufficient to employ a scheme such that there can be made, according to need, entirely the same access operation as in the case of the above-described row address cycle irrespective of the conventional operational mode, i.e., whether or not the row address changes. It is enough to prescribe in advance when the operational mode should be switched in dependency upon levels of respective signals. For example, this may be accomplished as follows. Initially, the relationship between the $\overline{CE}$ signal, the potential on the word line, and the potential of the control signal for controlling refresh ($\overline{REF}$ signal) in the conventional operational mode is shown in FIG. 3. From the time t1 when the $\overline{CE}$ signal has risen, after the precharge cycle time $t_P$ during which reset of the word line, and equalize and precharge of the bit line are carried out has passed (time t2), when the $\overline{REF}$ signal changes from H level to L level, sense and restore of data in the memory cell are conducted. From the time t3 when the $\overline{REF}$ signal has risen, after the time $t_P$ has passed (time t4), when the $\overline{CE}$ signal is fallen, the access operation can be continued. At this time, when the $\overline{CE}$ signal is at the H level and the $\overline{REF}$ signal shifts to L level (time t2), auto-refresh is carried out during the refresh time $t_{REF}$. Generally, when this time $t_{REF}$ exceeds a fixed time, the auto-refresh is automatically switched to self-refresh by the internal timer.

In respective signal waveforms having the above-mentioned relationship, by making such a prescription to switch the operational mode in the case where the $\overline{REF}$ signal is at L level at the time when the $\overline{CE}$ signal rises from L level, switching can be made. This circumstance is shown by the timing chart of FIG. 4. At this time, there are two conceivable cases where the bit line is equalized and precharged: one is the case where $\overline{CE}$ signal is at H level and $\overline{REF}$ signal is at H level, and the other is the case $\overline{REF}$ signal is at L level at the time when $\overline{CE}$ signal falls and the row address changes with respect to that in the last cycle. In view of this, an approach is employed to make an access in the conventional operational mode for a time period during a $\overline{REF}$ signal is maintained at H level, to switch the operational mode of this embodiment to carry out a proper use of the row address cycle or the column address cycle when the $\overline{REF}$ signal is L level at the time when the $\overline{CE}$ signal rises from L level. In FIG. 4, the hatched portion indicates that it is sufficient that the $\overline{REF}$ signal is at L level the moment the $\overline{CE}$ signal rises irrespective of what the level is. Thus, as shown in FIG. 5, if the $\overline{REF}$ signal is at L level from the time t1 when the $\overline{CE}$ signal has risen to the time t2, an access is made by the operational mode of this embodiment. When the operational mode is switched from the conventional mode so the row address changes with respect to that in the last access cycle, the operational mode enters the row address cycle (FIG. 4(b)), while when the row address does not change with respect to that in the last access cycle, the operational mode enters the column address cycle (FIG. 4(a)). Further, since the row address does not change in the column address cycle, a corresponding word line is maintained in a raised state. As a result, the potential on the word line remains at the H level. On the other hand, in the row address cycle, since another word line must be newly raised, the potential on the word line is lowered to L level as indicated by dotted lines.

Figure 6:
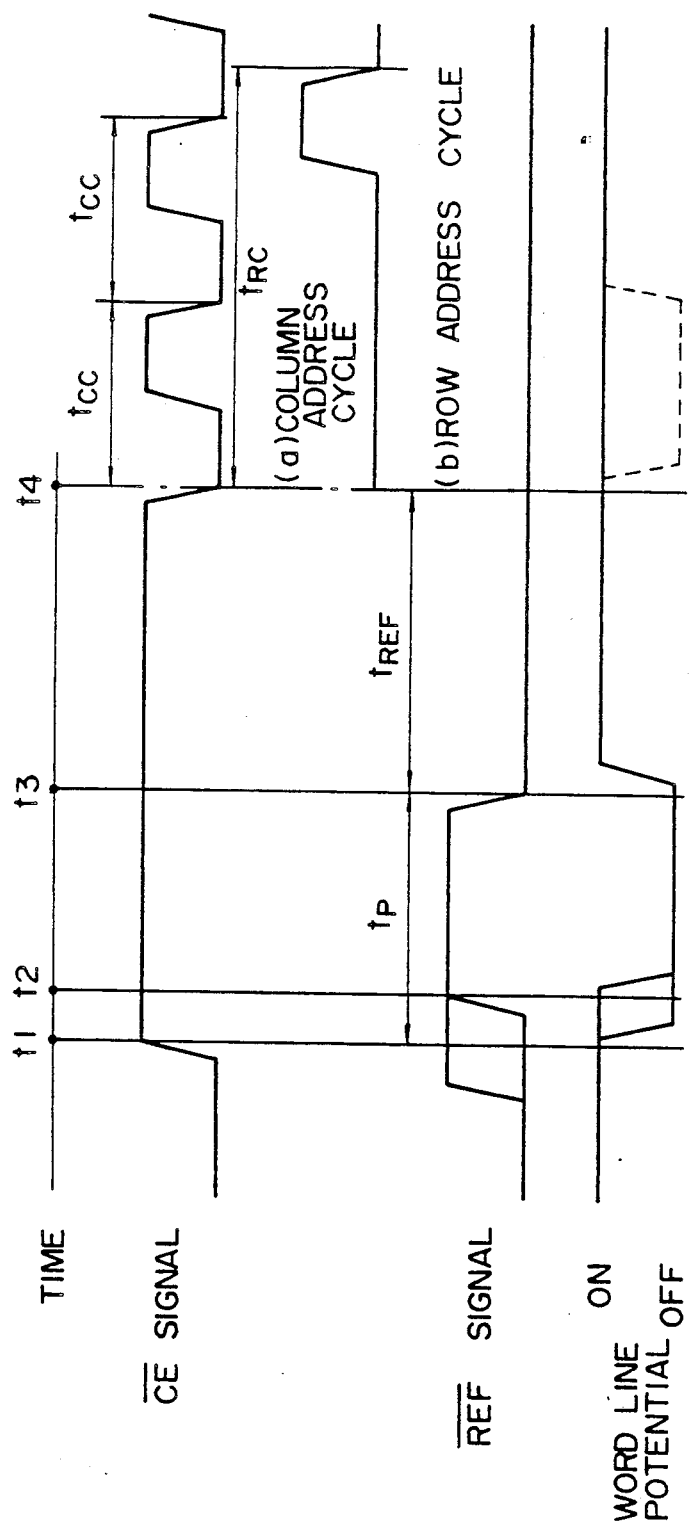
FIG. 6 is a timing chart showing respective signal waveforms in setting an auto refresh mode in the above-mentioned device.

Moreover, refresh is carried out for a time period during which the $\overline{CE}$ signal is at the H level and the $\overline{REF}$ signal is in a fallen state. Setting of refresh in the address access mode may be made as follows. Initially, in the case of the auto-refresh, as described above, if the length of the refresh time t$\overline{REF}$ is above a fixed time, switching is automatically made from self-refresh to the auto-refresh. As shown in FIG. 6, from the time when the $\overline{CE}$ signal and the $\overline{REF}$ signal both shift to the H level (t1 or t2), the precharge cycle is initiated. Thereafter, when the $\overline{REF}$ signal has fallen, the refresh is initiated. It is now assumed that when the $\overline{REF}$ signal rises earlier than the $\overline{CE}$ signal, the operational mode enters the precharge cycle from the time t1, while when the $\overline{REF}$ signal rises later than the $\overline{CE}$ signal, precharge is carried out from the time t2. While it is shown in FIG. 6 that a single auto-refresh operation is carried out, a plurality of auto-refresh operations may be conducted by allowing the $\overline{REF}$ signal to be at H level by the precharge cycle $t_P$ for a time period during which the $\overline{CE}$ signal is at H level. The prescription of this auto-refresh is made by the length of the refresh time $t_{REF}$. Such a shift from the refresh cycle to the address cycle is carried out by maintaining the $\overline{REF}$ signal at L level and by falling the $\overline{CE}$ signal (time t4). Thereafter, in the same manner as in the case having been described with reference to FIG. 4, the operational mode enters (a) the column address cycle or (b) the row address cycle in dependency upon whether or not the row address changes with respect to that in the last cycle.

Figure 7:
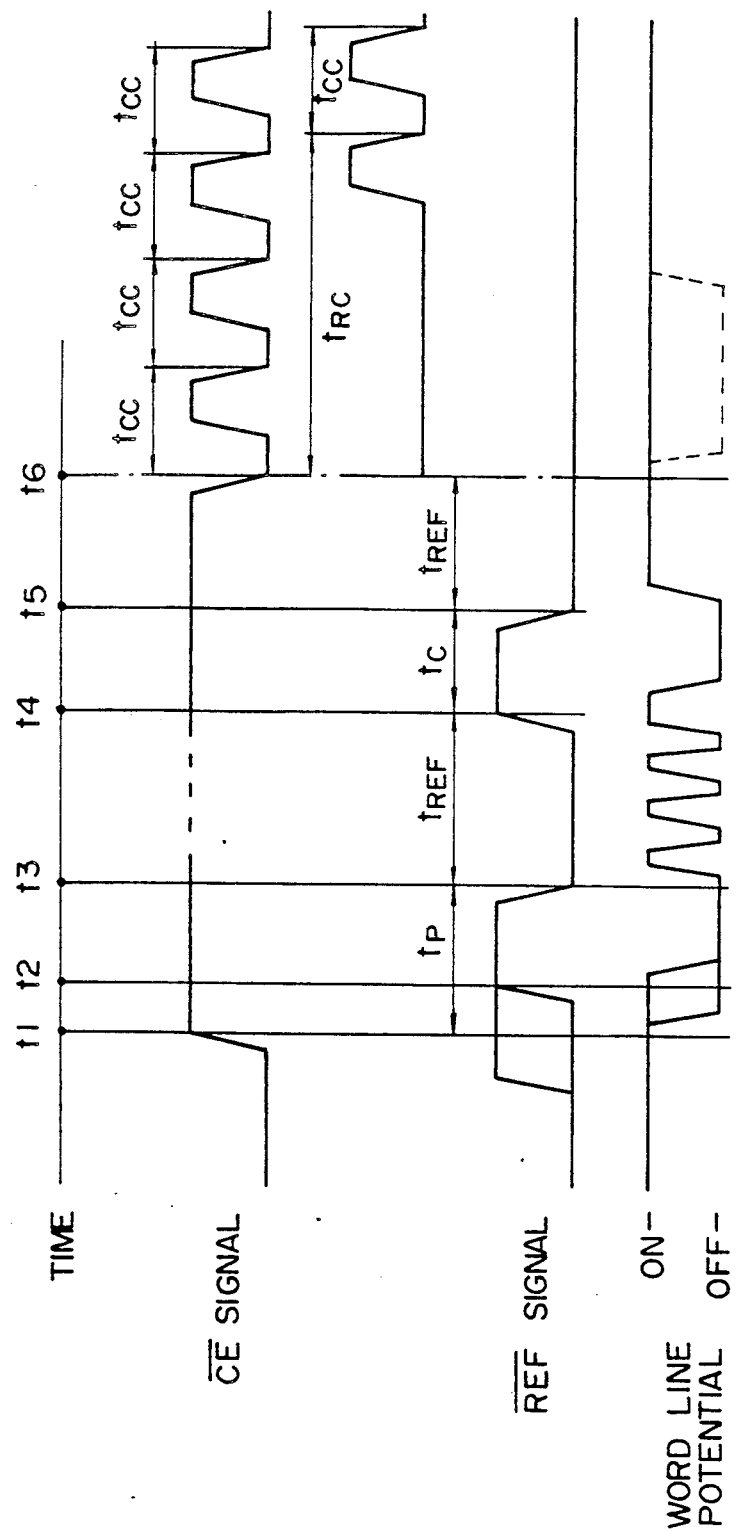
FIGS. 7 and 8 are timing charts showing respective signal waveforms in setting a self-refresh mode in the above-mentioned device.

Respective signal waveforms in the case of self-refresh is shown in FIG. 7. In the same manner as in the case of auto-refresh, where the $\overline{CE}$ signal is at H level and the $\overline{REF}$ signal is at H level (time t1 or t2), the precharge cycle is initiated. Thereafter, from the time t3 when the $\overline{REF}$ signal has fallen, the refresh cycle is initiated. Namely, the counter is subjected to incremental operation, so the refresh operation is carried out. There are two conceivable procedures the operational mode shifts from the refresh cycle to the address cycle. One procedure is, as shown in FIG. 7, to maintain the $\overline{REF}$ signal at H level during the cycle time $t_C$ after the refresh time $t_{REF}$ (time t4) to fall the $\overline{REF}$ signal after the precharge cycle is completed (time t5) to enter the auto-refresh cycle, thereafter making it possible to shift to the address cycle (time t6).

Figure 8:
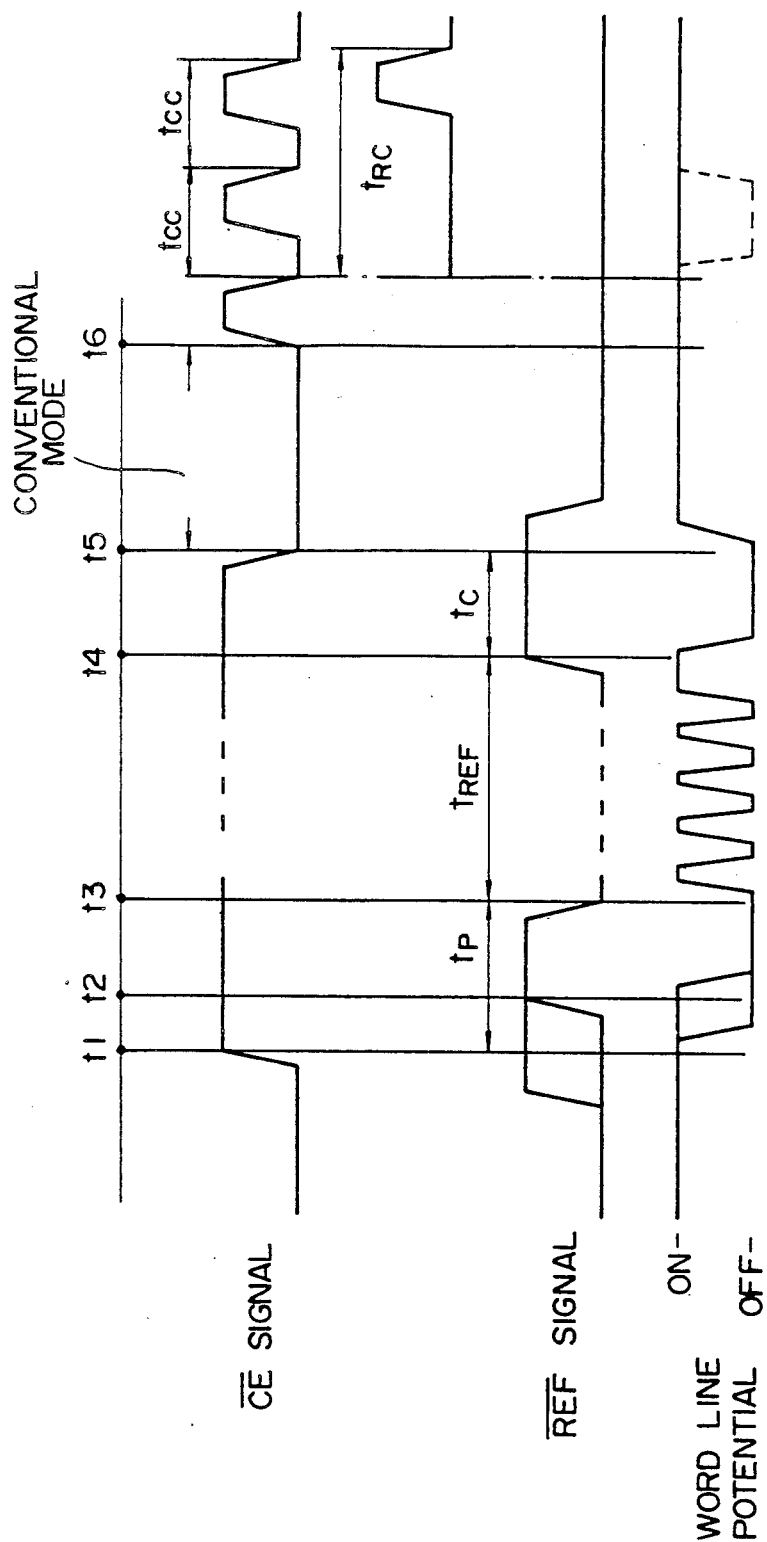

The other procedure is as shown in FIG. 8. After self-refresh is completed (time t4), H level is maintained during the cycle time $t_C$ to fall the $\overline{CE}$ signal while maintaining H level at time t5 when the precharge cycle is completed to fetch the address to once enter the conventional operational mode. By allowing the $\overline{REF}$ signal to be at the L level at time t6 when the $\overline{CE}$ signal rises, an access can be made by the operational mode of this embodiment. Thereafter, in the same manner as in the above-described case of FIGS. 4 and 6 to 8, the operational modes enters the column address cycle or the row address cycle in dependency upon whether or not the row address changes with respect to that in the last cycle.

To what degree the readout operation is performed at a high speed by the above-mentioned semiconductor memory device of this embodiment will now be described. It is initially assumed that after a single row address cycle is generated, this row address does not change and an n (n is an integer more than 1) number of column address cycles are generated in succession. In the conventional operational mode, every cycle time is the same. When this cycle time is represented by $t_C$, the entire cycle time is represented by $t_C (n+1)$. On the other hand, in the operational mode of this embodiment, when it is assumed that the row address cycle time $t_{RC}$ and the column address cycle time $t_{CC}$ are 150 ns and 50 ns, respectively, the entire cycle time is equal to 150+50·n. Now, the above-mentioned both cycle times are assumed to be equal to each other, thus allowing the transfer time in the conventional operational mode and that in the operational mode of this embodiment to be equivalent to each other. On the basis of this assumption, to what degree the cycle time $t_C$ is shortened as average depending upon the value of n, is determined from the following equation (1):

$$t_c = (150 + 50 \cdot n)/(n + 1) \qquad (1)$$
$$= 50 + 100/(n + 1)$$

Figure 9:
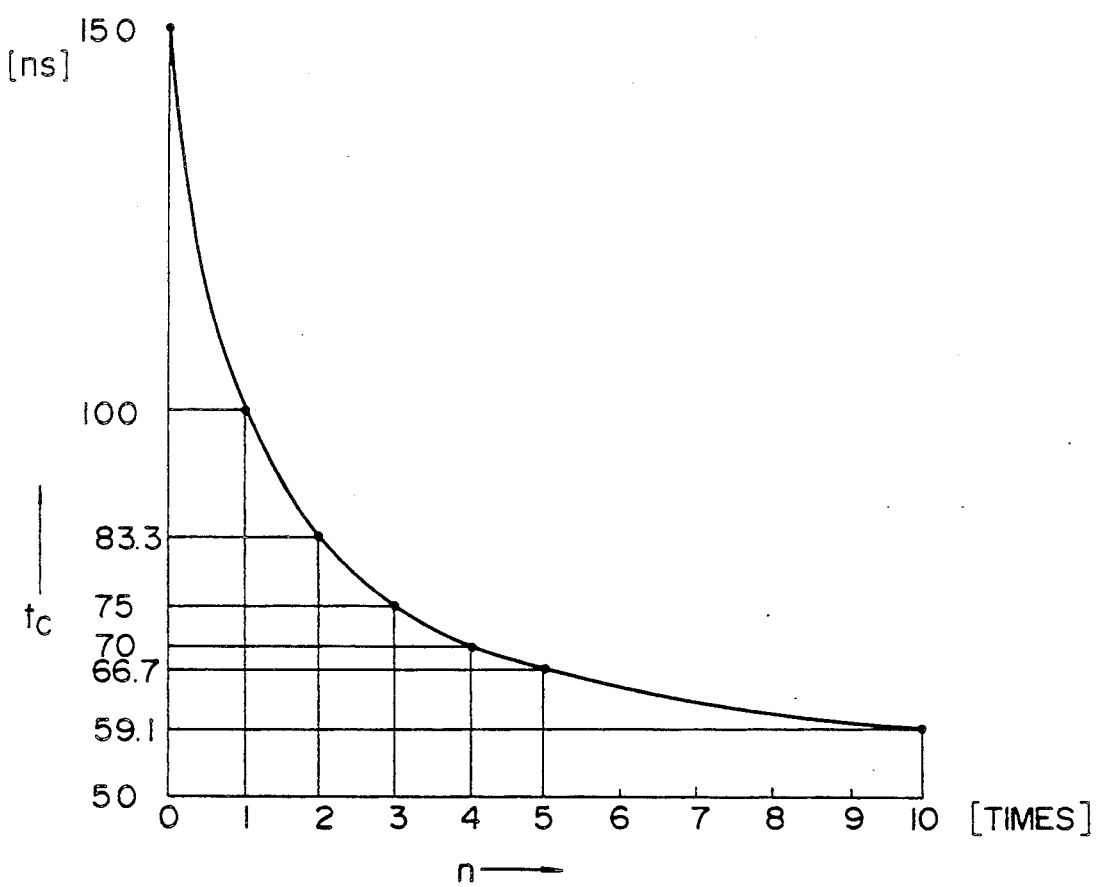
FIG. 9 is a graph showing to what degree the operation is carried out at a high speed.
Figure 10:
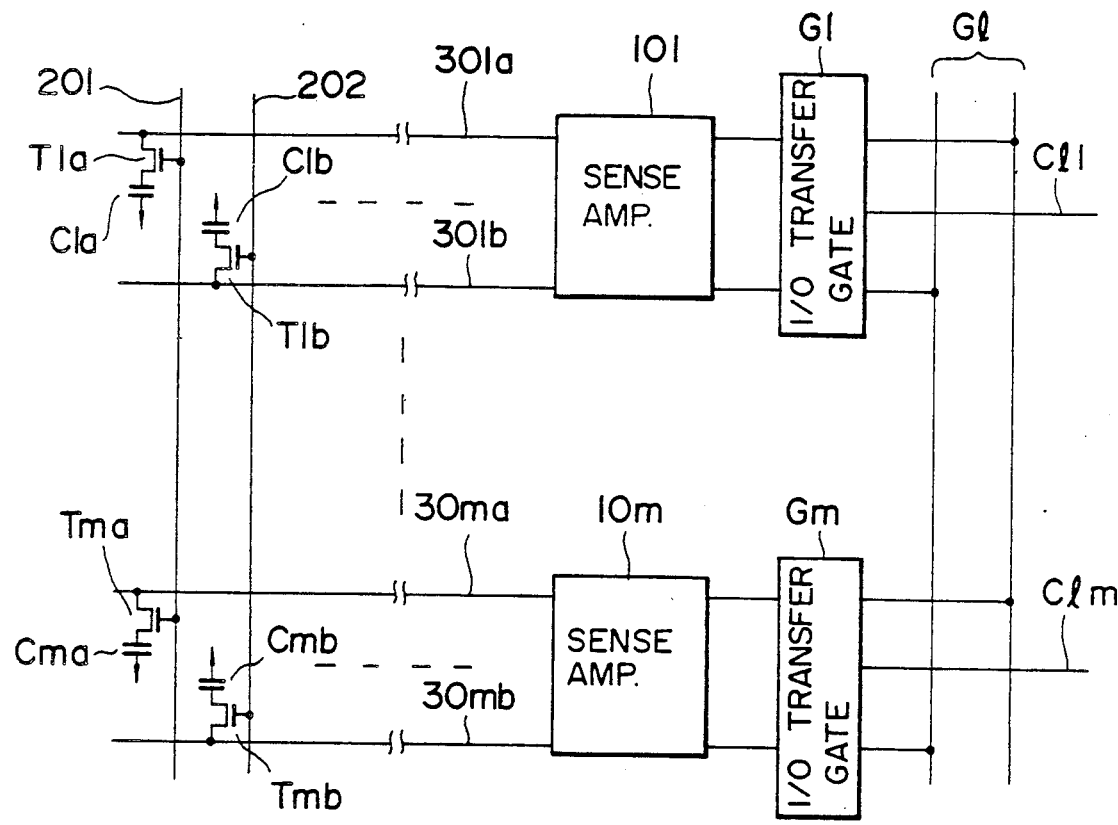
FIG. 10 is a block diagram showing the circuit configuration of a conventional semiconductor memory device.
Figure 11:
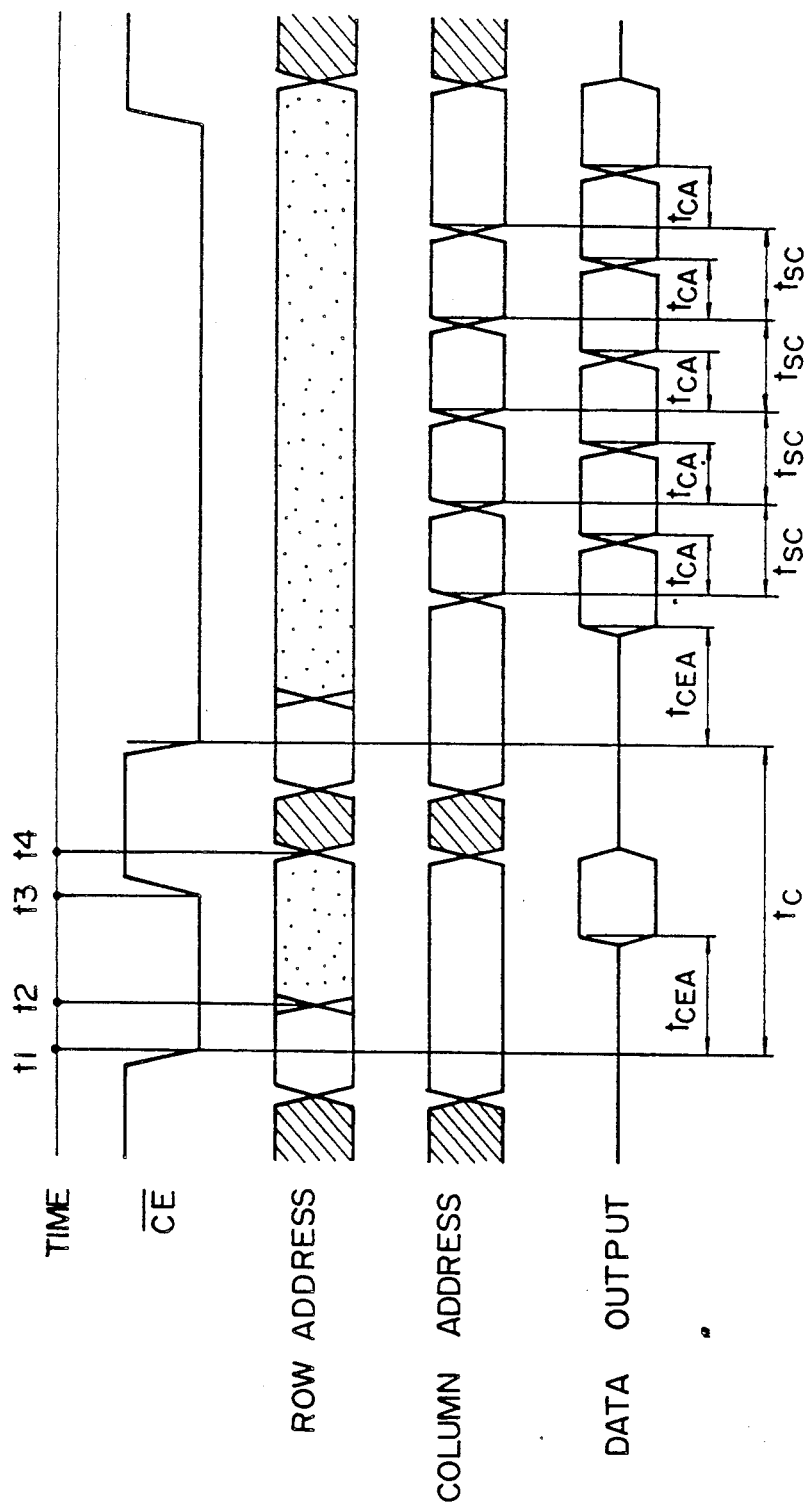
FIG. 11 is a timing chart showing respective signal waveforms in the above-mentioned device.

The relationship between the cycle time $t_C$ and the value of n is shown in FIG. 9. As a matter of course, the larger the value of n is, the greater the degree of improvement in speed is. When the case where n is equal to 5, i.e., five column address cycles are successive is taken as an example, the cycle time $t_C$ is equal to 66.7 ns. This time corresponds to an access time of 30 to 35 ns in ordinary DRAMs. It is seen from this fact that the effect that the operation is performed at a considerably high speed is provided.

As stated above, in accordance with the semiconductor memory device of this embodiment, high speed operation is provided and the transfer efficiency of data is improved. Moreover, since switching to the conventional operational mode can be also made, the software conventionally used can be applied without rewriting it, and the working efficiency can be improved. Further, inside this device, which portion of an address which has been read in corresponds to the row address is discriminated to judge whether or not this row address changes with respect to that in the last cycle to switch the operational mode to the row address cycle or the column address cycle in dependency upon the judged result. Accordingly, it is unnecessary to discriminate the address on the system side outside the device. Thus, the device is simplified as a system. Furthermore, since it is unnecessary for a system side to alter the control in dependency upon whether or not the row address changes, an employment of PSRAM effectively exhibits the merit that the device of PSRAM structure is more simplified than that of DRAM structure in medium and small scale systems. In addition, this device is constructed so that an access can be made by the conventional operational mode as well. This is convenient in that compatibility with the existing software is maintained.

The above-described embodiments are all only exemplified, and therefore they do not limit this invention. For example, switching of the operational mode may be carried out by a prescription different from the combination of respective signal levels shown in FIG. 4.

What is claimed is:

1. A semiconductor memory device comprising:

hold means for holding row addresses at least in the access cycle and the last access cycle of fetched addresses, comparison means for judging whether or not said row address in the present access cycle and said row address in the last access cycle are in correspondence with each other, a circuit for selecting a word line by a fetched row address to drive it, means for precharging a bit line of a memory cell belonging to the selected word line, means for sensing data transferred from said memory cell to said precharged bit line, means for selecting a transfer gate by a column address of said fetched addresses to open said transfer gate, to thus read out data from a corresponding bit line, and control means responsive to a judged result from said comparison means wherein when said row address fetched in the present access cycle is not in correspondence with said row address fetched in the last access cycle, said control means allows said sense means to carry out a sense operation on the basis of the present row address, and allows said readout means to read out data on the basis of the present column address, while when said row address fetched in the present access cycle is in correspondence with said row address fetched in the last access cycle, said control means allows said data readout means to read out data already sensed in said access cycle on the basis of the present column address without causing said sense means to carry out a sense operation.

2. A semiconductor memory device as set forth in claim 1, which further comprises means for outputting, to the external system, a wait signal for inhibiting start of the next access cycle until the present access cycle is completed when said comparison means has judged that a row address fetched in the present access cycle is not in correspondence with a row address in the last access cycle.

3. A semiconductor device as set forth in claim 1, which further comprises operational mode switching means responsive to an operational mode switching signal to give, to said control means, a notification to allow said sense means to perform a sense operation on the basis of a row address fetched in the present access cycle in the entire access cycles irrespective of a judged result from said comparison means, thereafter to allow said readout means to read out data on the basis of the present column address.

* * * * *